(12) United States Patent
Dobrenizki et al.

(10) Patent No.: US 11,380,908 B2
(45) Date of Patent: Jul. 5, 2022

(54) COATING AND LAYER SYSTEM, AND BIPOLAR PLATE, FUEL CELL AND ELECTROLYSER

(71) Applicant: Schaeffler Technologies AG & Co. KG, Herzogenaurach (DE)

(72) Inventors: Ladislaus Dobrenizki, Höchstadt (DE); Yashar Musayev, Nuremberg (DE); Tim Hosenfeldt, Nuremberg (DE); Detlev Repenning, Reinbeck (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 236 days.

(21) Appl. No.: 16/638,186

(22) PCT Filed: Jun. 11, 2018

(86) PCT No.: PCT/DE2018/100551
§ 371 (c)(1),
(2) Date: Feb. 11, 2020

(87) PCT Pub. No.: WO2019/029762
PCT Pub. Date: Feb. 14, 2019

(65) Prior Publication Data
US 2020/0365912 A1 Nov. 19, 2020

(30) Foreign Application Priority Data

Aug. 11, 2017 (DE) .................. 10 2017 118 319.1

(51) Int. Cl.
| | | |
|---|---|---|
| *H01M 8/0228* | (2016.01) | |
| *C23C 14/06* | (2006.01) | |
| *C23C 14/16* | (2006.01) | |
| *H01M 8/021* | (2016.01) | |
| *H01M 8/0206* | (2016.01) | |
| *H01M 8/10* | (2016.01) | |

(52) U.S. Cl.
CPC ....... *H01M 8/0228* (2013.01); *C23C 14/0635* (2013.01); *C23C 14/0641* (2013.01); *C23C 14/16* (2013.01); *H01M 8/021* (2013.01); *H01M 8/0206* (2013.01); *H01M 2008/1095* (2013.01); *Y02E 60/50* (2013.01); *Y10T 428/12493* (2015.01)

(58) Field of Classification Search
CPC .................. H01M 8/0206; H01M 8/0228
USPC .......................................... 429/518
See application file for complete search history.

(56) References Cited

U.S. PATENT DOCUMENTS

| 4,127,468 A | 11/1978 | Alfenaar et al. |
| 2011/0033784 A1 | 2/2011 | Ljungcrantz et al. |
| 2016/0233525 A1 * | 8/2016 | Ricketts .............. H01M 8/0228 |

FOREIGN PATENT DOCUMENTS

| CN | 1772664 A | 5/2006 |
| CN | 102017254 A | 4/2011 |
| DE | 19937255 A1 | 2/2001 |
| DE | 10017200 A1 | 10/2001 |
| DE | 112005001704 T5 | 8/2009 |
| DE | 112008003275 T5 | 9/2010 |
| DE | 102010022231 A1 | 1/2011 |
| DE | 102010026330 A1 | 4/2011 |
| DE | 102013209918 A1 | 12/2013 |
| DE | 102016202372 A1 | 8/2017 |
| EP | 1273060 A1 | 1/2003 |
| JP | 2011517013 A | 5/2011 |
| WO | 2017140293 A1 | 8/2017 |

* cited by examiner

Primary Examiner — James M Erwin

(57) ABSTRACT

A coating for a bipolar plate of a fuel cell or an electrolyzer contains a homogeneous or heterogeneous solid metal solution. The coating contains at least 15% Iridium and up to 84% Ruthenium with a total combined concentration of Iridium and Ruthenium of at least 99% (atomic). The coating also contains at least one of Nitrogen, Carbon, and Flourine. The coating may contain traces of Oxygen or Hydrogen. The coating may be used as part of a layer system that includes one or more undercoat layers and the coating as a covering layer.

19 Claims, No Drawings

COATING AND LAYER SYSTEM, AND BIPOLAR PLATE, FUEL CELL AND ELECTROLYSER

CROSS-REFERENCE TO RELATED APPLICATIONS

This application is the U.S. National Phase of PCT Appln. No. PCT/DE2018/100551 filed Jun. 11, 2018, which claims priority to DE 10 2017 118 319.1 filed Aug. 11, 2017, the entire disclosures of which are incorporated by reference herein.

TECHNICAL FIELD

The disclosure relates to a coating, in particular for a bipolar plate of a fuel cell or an electrolyser. Furthermore, the disclosure relates to a layer system comprising such a coating and also a bipolar plate comprising such a layer system. The disclosure further relates to a fuel cell or an electrolyser comprising such a bipolar plate.

BACKGROUND

Electrochemical systems such as fuel cells, in particular polymer electrolyte fuel cells, and conductive, current-collecting plates for such fuel cells and electrolysers and also power outlet leads in electrochemical cells and electrolysers are known.

An example is the bipolar or monopolar plates in fuel cells, especially in an oxygen half cell. The bipolar or monopolar plates are configured in the form of carbon plates (e.g. Grafoil plates) which contain carbon as a main constituent. These plates tend to be brittle and are comparatively thick, so that they significantly reduce a performance volume of the fuel cell. A further disadvantage is their lack of physical (e.g. thermomechanical) and/or chemical and/or electrical stability.

The production of the current-collecting plates of the fuel cell from metallic (in particular austenitic) stainless steels is likewise known. The advantage of these plates is an achievable thickness of the plates of less than 0.5 mm. This thickness is desirable for a construction volume and also for a weight of the fuel cell to be able to be kept as small as possible. A problem associated with these plates is that surface oxides are formed during operation of fuel cell, so that a surface resistance is unacceptably increased and/or electrochemical disintegration (for example corrosion) occurs.

To achieve requirements, e.g. for the use of bipolar plates of fuel cells, the first publications DE 10 2010 026 330 A1, DE 10 2013 209 918 A1, DE 11 2005 001 704 T5 and DE 11 2008 003 275 T5 disclose coating of austenitic stainless steels as support with a gold layer which has a thickness in the range up to 2 nm. This solution to the requirements suffers from a number of disadvantages. For example, a gold layer having a thickness of only 2 nm is still too expensive for mass applications. A substantially greater disadvantage is a basic property of the chemical element gold. Gold is more noble than the support material composed of non-rusting austenitic steel (stainless steel) and therefore brings about dissolution of the support (pit corrosion) under unfavorable operation conditions in the fuel cells, which results in a reduction in the life. Especially in a chloride-containing environment (e.g. aerosols), corrosion cannot be prevented.

A further disadvantage is, in particular, that gold is not stable either in an acidic or basic environment for high-power applications, e.g. under electrolysis conditions above 1500 mV versus standard hydrogen electrode.

Layers on the support in the form of hard material layers based on nitride or carbide are likewise known from the prior art. An example is titanium nitride, but this tends to form oxidic metal complexes through to closed surface layers during operation of a fuel cell. As a consequence, the surface resistance increases to high values as in the case of stainless steel. Processes for coating with chromium nitride or chromium carbonitride are disclosed, for example, in the patent texts DE 199 37 255 B4 and EP 1273060 B1 and the first publication DE 100 17 200 A1.

The hard material layers have, depending on composition, very good operational properties (for example resistance to corrosion, abrasion resistance, high contour accuracy) but incur the risk of anodic dissolution when concentration chains are formed under unfavorable operation conditions in the fuel cell. This anodic dissolution appears when, in the event of internal electrochemical short circuits in the fuel cell, e.g. when a water film is formed between an active electrode of a membrane-electrode assembly of the fuel cell and the bipolar plate, a local element or an unexpected and undesirable reaction element thus arises.

Multiple coatings based on nitrides with very thin gold or platinum layers are likewise known. Thus, satisfactory operating results for a fuel cell can be achieved at layer thicknesses of the noble metals of more than 2 µm. The fundamental problem of dissolution persists at high anodic potentials. The layer thickness ensures virtually pore-free coverage and thus decreases the risk of pit corrosion.

Furthermore, what are known as dimensionally stable anodes are known. Here, single-phase or multiphase oxides comprising ruthenium oxide and/or iridium oxide are formed with the assistance of refractory metals. Although this type of layer is very stable, it forms electrical resistances which are too high. A corresponding situation is present when a surface of the support, generally made of a noble metal, is doped with iridium.

Thus, the metallic supports employed in these electrochemical systems mentioned by way of example, in particular for energy conversion, or a bipolar plate for a PEM fuel cell or an electrolyser have to meet the following requirements:

high corrosion resistance toward a medium surrounding them,
high resistance to anodic or cathodic polarizing stresses,
low surface resistance of a surface of the support or a coating thereof facing an electrolyte, and
low production costs of the support, in particular of, for example, an electrically conductive conductor in the form of bipolar plates, for use in fuel cells for mobile and stationary applications.

SUMMARY

It is therefore desirable to provide an improved coating or an improved layer system quite generally for an energy converter, in particular for a bipolar plate of a fuel cell or an electrolyser. Furthermore, it is desirable to provide a bipolar plate comprising an improved layer system and a fuel cell equipped therewith and an electrolyser equipped therewith.

A coating, in particular for a bipolar plate of a fuel cell or an electrolyser, consists of a homogeneous or heterogeneous solid metallic solution which either contains a first chemical element from the group of the noble metals in the form of iridium in a concentration of at least 99 at. % or contains a first chemical element from the group of the noble metals in the form of iridium and a second chemical element from the group of the noble metals in the form of ruthenium, with the first chemical element and the second chemical element being present in a total concentration of at least 99 at. %, and also contains at least one further nonmetallic chemical element from the group consisting of nitrogen, carbon, fluorine, with oxygen and/or hydrogen optionally being additionally present only in traces.

A layer system, in particular for a bipolar plate or a fuel cell or an electrolyser, includes a covering layer and an undercoat layer system, in which the covering layer is configured in the form of the coating.

A bipolar plate includes a substrate and the layer system applied to at least parts of a surface of the substrate.

A fuel cell, in particular polymer electrolyte fuel cell, includes at least one of the bipolar plates.

An electrolyser includes at least one of the bipolar plates.

The coating is electrically conductive and electrocatalytically active and also protects against corrosion.

For the purposes of the present document, a homogeneous metallic solution (type 1) means that the nonmetallic chemical elements mentioned are dissolved in the metal lattice in such a way that the lattice type of the host metal or the host metal alloy is not significantly changed.

For the purposes of the present document, a heterogeneous metallic solution means that one of the nonmetallic chemical elements is present in elemental form in a mixed phase in addition to the metal-containing phase. For example, depending on the structure of the phase diagram, elemental carbon can be present in addition to the alpha phase (type 1).

Depending on deposition conditions, the layer can be metastable or stable in the thermodynamic sense.

It has been found that in the case of a carbon-containing layer, thus as a result of the use of the metalloid or nonmetallic chemical element carbon, the conductivity of the layer is greater than in the case of gold and that at the same time the oxidation stability of the layer in an acidic solution is significantly above a voltage of 2000 mV relative to a standard hydrogen electrode. Measured specific electric resistances are comparable to that of gold (under standardized conditions, i.e. at a contact pressure of 140 N/cm$^2$). The specific electrical resistance of gold is about 10 mΩ cm$^{-2}$ at room temperature (T=20° C.).

A further important advantage is that iridium does not oxidize and go into solution at voltages above the value E=2.04-0.059 lg pH--0.0295 lg $(IrO_4)^{2-}$. The low-valence iridium is thus stabilized in the solid solution to such an extent that the otherwise usual oxidation at about 1800 mV in 1 mol/l (1N) sulfuric acid ($H_2SO_4$) no longer takes place. A measure of the stabilization is the gain of free partial mixing energy $\Delta G_{mix}$ of the solid solutions or compounds.

The coating preferably has a layer thickness of from at least 1 nm to a maximum of 10 nm.

For example, at a layer thickness of about 10 nm when using $Ir_xC_{1-x}$ there are only 4 μg of iridium per cm$^2$ of the layer. In the case of a 10 nm thick gold layer, more than 20 μg of gold per cm$^2$ have to be used. The advantage of the coating compared to a gold layer is the high oxidation stability up to voltages far above 2000 mV relative to a standard hydrogen electrode in 1N sulfuric acid.

The stability of, for example, iridium-containing dimensionally stable anode electrodes can be increased significantly by means of the coating.

The at least one nonmetallic chemical element, i.e. carbon and/or nitrogen and/or fluorine, is preferably present in a concentration in the range from 0.1 at. % to 1 at. % in the coating. The nonmetallic chemical element carbon may be present in the concentration range from 0.10 to 1 at. % in the coating. The nonmetallic chemical element nitrogen may be present in the concentration range from 0.10 to 1 at. % in the coating. The nonmetallic chemical element fluorine may be present in the concentration range up to a maximum of 0.5 at. % in the coating.

In particular, a layer which
a) comprises at least 99 at. % of iridium and additionally carbon; or
b) comprises at least 99 at. % of iridium and additionally carbon and traces of oxygen and/or hydrogen; or
c) comprises at least 99 at. % of iridium and additionally carbon and fluorine, optionally also traces of oxygen and/or hydrogen; or
d) comprises a total of from at least 15 to 98.9 at. % of iridium and from 0.1 to 84 at. % of ruthenium and additionally carbon; or
e) comprises a total of from at least 15 to 98.9 at. % of iridium and from 0.1 to 84 at. % of ruthenium and additionally carbon and traces of oxygen and/or hydrogen; or
f) comprises a total of from at least 15 to 98.9 at. % of iridium and from 0.1 to 84 at. % of ruthenium and additionally carbon and fluorine, optionally also traces of oxygen and/or hydrogens,
has proved worthwhile.

Furthermore, the coating can contain at least one chemical element from the group of the base metals. The at least one chemical element from the group of the base metals is preferably formed by aluminum, iron, nickel, cobalt, zinc, cerium or tin and/or is present in the concentration range from 0.005 to 0.01 at. % in the coating.

The coating may also include at least one chemical element from the group of the refractory metals, in particular titanium and/or zirconium and/or hafnium and/or niobium and/or tantalum. It has been found that the addition of the refractory metals additionally makes it possible to control $H_2O_2$ and ozone which are partially formed during the electrolysis.

A further advantage of the use of these metals, either in elemental form or in the form of compounds, is that they form self-protecting, stable and conductive oxides under corrosion conditions.

The layer comprising at least one refractory metal has a high conductivity and high corrosion resistance, especially in a temperature range from 0 to about 200° C. This gives excellent properties for long-term use in, for example, fuel cells.

A further advantage arises from the coating of electrical conductors, in particular metallic bipolar plates, regardless of whether the electrical conductor is configured as, for example, a bipolar plate for low-temperature polymer electrolyte fuel cells or for high-temperature polymer electrolyte fuel cells. The particular advantage is that the coating having a density of 10-13 gcm$^{-3}$ has only about half the density of a pure noble metal. The use of expensive noble metals and/or compounds thereof can thus be reduced.

The at least one chemical element from the group of the refractory metals is preferably present in the concentration range from 0.005 to 0.01 at. % in the layer.

If the at least one chemical element from the group of the base metals is present in the form of tin, this and the at least one chemical element from the group of the refractory metals are together present in the concentration range from 0.01 to 0.2 at. % in the layer.

It has been found to be useful for the layer to additionally comprise at least one additional chemical element from the group of the noble metals in a concentration range from 0.005 to 0.9 at. %. The chemical element from the groups of the noble metals is, in particular, platinum, gold, silver, rhodium, palladium.

It has been found to be useful for all chemical elements from the group of the noble metals, i.e. together with iridium and ruthenium, to be present in the concentration range of greater than 99 at. % in the layer.

The corrosion protection on metallic supports such as steels, in particular stainless steels, or titanium is improved further by the coating being applied to a undercoat layer system formed between the support and the coating. This is advantageous particularly when corrosive surrounding media are present, in particular when the corrosion media are chloride-containing.

Underoxidation, i.e. oxidation of the surface of a support provided with a coating applied to this surface, normally leads to delamination of noble metal layers located thereon.

The layer system, in particular for a bipolar plate of a fuel cell or an electrolyser, therefore comprises a covering layer and an undercoat layer system, with the covering layer being configured in the form of the coating.

In particular, the undercoat layer system comprises at least one undercoat layer comprising at least one chemical element from the group titanium, niobium, hafnium, zirconium, tantalum.

The undercoat layer system comprises, in particular, a first undercoat layer in the form of a metallic alloy layer comprising the chemical elements titanium and niobium, in particular 20-50% by weight of niobium and balance titanium.

The undercoat layer system comprises, in particular, a second undercoat layer comprising at least one chemical element from the group titanium, niobium, zirconium, hafnium, tantalum and additionally at least one nonmetallic element from the group nitrogen, carbon, boron, fluorine.

The undercoat layer system may include a second undercoat layer comprising the chemical elements
a) titanium, niobium and additionally carbon and fluorine, or
b) titanium, niobium and additionally nitrogen, and is in particular formed by $(Ti_{0.67}Nb_{0.33})_{1-x}N_x$ where $x=0.40$-$0.55$.

Here, the material denoted by $(Ti_{0.67}Nb_{0.33})_{1-x}N_x$ where $x=0.40$-$0.55$ is formed by the second undercoat layer being produced by atomization of a target composed of $Ti_{0.67}Nb_{0.33}$, with nitrogen from the gas phase being incorporated in a concentration of from 40 to 55 at. % into the second undercoat layer.

The second undercoat layer is preferably arranged between the first undercoat layer and the covering layer.

The second undercoat layer can additionally contain up to 5 at. % of oxygen.

The bipolar plate comprises a metallic substrate and a layer system applied to at least parts of the surface of the substrate. In particular, the layer system is applied to the full area of one or both sides of the plate-like substrate. The metallic substrate is, in particular, composed of steel or titanium, preferably stainless steel. A thickness of the substrate is preferably less than 1 mm and is in particular 0.5 mm.

A fuel cell, in particular a polymer electrolyte fuel cell, comprising at least one bipolar plate has been found to be particularly advantageous in respect of the electrical values and the corrosion resistance. In particular, oxidation stabilities at 2000 mV, measured as a change in the surface resistance in $m\Omega\ cm^{-2}$ of less than 20 $m\Omega\ cm^{-2}$ can be attained. Such a fuel cell therefore has a long life of more than 10 years or more than 5000 hours of operation in a motor vehicle or more than 60,000 hours of operation in stationary applications.

In the case of an electrolyser, which operates according to the reverse working principle of a fuel cell and brings about a chemical reaction, i.e. a transformation of material, by means of electric current, comparably long lives can be achieved. In particular, the electrolyser is an electrolyser suitable for hydrogen electrolysis.

Advantageously, a thickness of the coating of less than 10 nm is sufficient in order to protect against a resistance-increasing oxidation of the second undercoat layer. To form secured corrosion protection, sublayers of the undercoat layer system are formed from at least one refractory metal and are applied in at least two layers to the steel, in particular stainless steel, firstly as metal or alloy layer (=first undercoat layer) and then as metalloid layer (=second undercoat layer). The double layer formed by means of the two-layer structure under the coating firstly ensures electrochemical matching to a support material, i.e. the material of which the support is made, and secondly pore formation due to oxidation and hydrolysis processes is ruled out.

The electrochemical matching to the support material is necessary since both the metalloid layer (=second undercoat layer) and the coating or the covering layer are very noble. Pore formation would build up high local element potentials leading to impermissible corrosion currents. The metallic first undercoat layer is preferably formed by titanium or niobium or zirconium or tantalum or hafnium or alloys of these metals, which are less noble than the support material in the form of steel, in particular stainless steel, and in the event of corrosion processes firstly react to form insoluble oxides or voluminous, sometimes gel-like hydroxo compounds of these refractory metals. As a result, the pores grow shut and protect the underlying material against corrosion. The process represents self-healing of the layer system.

A second undercoat layer in the form of a nitridic layer, in particular, serves as hydrogen barrier and thus protects the substrate, in particular composed of stainless steel, of the bipolar plate and also the metallic first undercoat layer against hydrogen embrittlement.

BRIEF DESCRIPTION OF THE DRAWINGS

Further advantages, features and details may be derived from the following description and the FIGURE. The features and feature combinations mentioned above in the description can be employed not only in the combination indicated in each case but also in other combinations or alone.

DETAILED DESCRIPTION

The FIGURE shows a bipolar plate 1 comprising a substrate 2 composed of stainless steel and a layer system 3 applied over the full area on one side of the substrate 2. The layer system 2 comprises a covering layer 3a and an undercoat layer system 4 comprising a first undercoat layer 4a and a second undercoat layer 4b.

In a first working example, a metallic substrate 2 in the form of a conductor, here for a bipolar plate 1 of a polymer electrolyte fuel cell for reaction of (reformed) hydrogen, composed of a stainless steel, in particular an austenitic steel meeting very demanding known requirements in respect of corrosion resistance, e.g. having the DIN ISO material number 1.4404, is produced.

A layer system 3 is formed on the substrate 2 of the bipolar plate 1 by means of a coating process, for example a vacuum-based coating process (PVD), with the substrate 2 firstly being coated with a first undercoat layer 4a in the form of a 0.5 μm thick titanium layer in one process pass, subsequently with a 1 μm thick second undercoat layer 4b in the form of a titanium nitride layer and subsequently with a covering layer 3a in the form of a 10 nm thick iridium-carbon layer. The covering layer 3a corresponds to a layer which is open on one side since only a covering layer area of a further layer, here the second undercoat layer 4b, contacts it. The free surface 30 of the covering layer 3a in a fuel cell thus directly adjoins and is exposed to an electrolyte, in particular a polymer electrolyte.

In a second working example, the metallic substrate 2 for the bipolar plate 1 is firstly coated with a first undercoat layer 4a in the form of a metallic alloy layer having a thickness of 100 nm, with the metallic alloy layer having the composition $Ti_{0.67}Nb_{0.33}$. A further application of a second undercoat layer 4b having a thickness of 400 nm and the composition $(Ti_{0.67}Nb_{0.33})_{1-x}N_x$ where x=0.40-0.55 is subsequently carried out. A covering layer 3a having a thickness of 10 nm and the composition iridium-carbon is then applied thereto.

The advantage is an extraordinarily high stability to oxidation of the bipolar plate 1. Even under a long-term electric potential of +3000 mV relative to a standard hydrogen electrode, no increase in resistance is observed in sulfuric acid solution having a pH of 3. On the outside, the free surface 30 of the covering layer 3a, i.e. the surface of the covering layer 3a facing away from the substrate 2, remains silvery and shining even after long-term application of +2000 mV relative to a standard hydrogen electrode for 50 hours. Even in a scanning electron microscopic examination, no traces of corrosion extending through the thickness of the covering layer 3a to the substrate 2 or reaching the substrate 2 can be discerned.

The covering layer 3a of the second working example can be applied either by means of the vacuum-based PVD sputtering technique or by means of a cathodic ARC coating process, also known as vacuum electric arc vaporization. Despite a higher number of droplets, in other words an increased number of metal droplets compared to the sputtering technology, the covering layer 3a produced in the cathodic ARC process also has the advantageous properties of high corrosion resistance combined with time-stable surface conductivity of the covering layer 3a produced by means of the sputtering technique.

In a third working example, the layer system 3 is formed on a substrate 2 in the form of a structured perforated stainless steel plate. The substrate 2 has been electrolytically polished in an $H_2SO_4/H_3PO_4$ bath before application of a layer system 3. After application of a single undercoat layer in the form of a tantalum carbide layer having a thickness of several 1000 nm, a covering layer 3a in the form of an iridium-carbon layer having a thickness of several 100 nm is applied.

The advantage of the undercoat layer composed of tantalum carbide is not only its extraordinary corrosion resistance but also that it does not absorb hydrogen and thus serves as a hydrogen barrier for the substrate 2. This is particularly advantageous when titanium is used as substrate material.

The layer system 3 of the third working example is suitable for use of an electrolysis cell for producing hydrogen at current densities i which are greater than 500 mA $cm^{-2}$.

The advantage of the metalloid layer which is located in an intermediate position and/or is closed on both sides in the layer system or the second undercoat layer, which in the simplest case is composed of, for example, titanium nitride, is its low electrical resistance of 10-12 mΩ $cm^{-2}$. Likewise, the coating or covering layer can also be formed without a second undercoat layer or metalloid layer, possibly with an increase in resistance.

Some layer systems together with their characteristic values are shown by way of example in table 1.

TABLE 1

Layers and selected characteristic values

| | Layer system/layer thickness | Specific surface resistance in mΩ $cm^{-2}$ at T = 20° C. | Corrosion current at 2000 mV vs. standard hydrogen electrode in μA $cm^{-2}$ in aqueous sulfuric acid solution (pH = 3) at T = 80° C. | Oxidation stability at 2000 mV measured as change in the surface resistance in mΩ $cm^{-2}$ Value: <20 mΩ $cm^{-2}$ |
|---|---|---|---|---|
| 1 | Gold/3 μm (as reference) | 9 | >100 pitting current | 9-10 |
| 2 | Ti/0.5 μm TiN/1 μm $Ir_{0.99}$-$C_{0.01}$/10 nm | 8 | 0.001 | 12 |
| 3 | $Ti_{0.67}Nb_{0.33}$/0.1 μm $(Ti_{0.67}Nb_{0.33})_{1-x}N_x$ where x = 0.40-0.55/0.4 μm $Ir_{0.99}$-$C_{0.01}$/10 nm | 7-8 | 0.01 | 1-2 |
| 4 | Zr/0.5 μm ZrN/1 μm $Ir_{0.99}$-$C_{0.01}$/10 nm | 11 | 0.001 | 11-12 |
| 5 | Ta/0.05 μm TaC/0.5 μm $Ir_{0.991}$-$C_{0.009}$/5 nm | 10 | 0.001 | 17-18 |
| 6 | $ZrB_2$/0.3 μm $Ir_{0.7}$-$B_{0.3}$/5 nm | 7 | Pitting reaction after stressing for 4 h | |

Only some illustrative layer systems are presented in table 1. The layer systems advantageously display no increase in resistance over a number of weeks at an anodic voltage of +2000 mV relative to a standard hydrogen electrode in sulfuric acid solution at a temperature of 80° C. The layer systems applied in a high vacuum by means of a sputtering or ARC process or in a fine vacuum by means of PECVD processes (plasma-enhanced chemical vapor deposition processes) or in an ALD process (atomic layer deposition) in some cases had a dark discoloration after this stressing time. However, no visible corrosion phenomena or significant changes in the surface resistance occurred.

LIST OF REFERENCE NUMERALS

1 Bipolar plate

2 Substrate

3 Layer system

3a Covering layer

4 Undercoat layer system

4a First undercoat layer

4b Second undercoat layer

5 Free surface

The invention claimed is:

1. A coating for an energy converter, wherein the coating comprises a homogeneous or heterogeneous solid metallic solution which either
    contains a first chemical element of iridium in a concentration of at least 99 at. % or
    contains a first chemical element of iridium and a second chemical element of ruthenium, with the first chemical element and the second chemical element being present in a total concentration of at least 99 at. %,
    and also contains at least one further nonmetallic chemical element selected from the group consisting of nitrogen, carbon, and fluorine present in a concentration in the range from 0.1 to 1 at. %, with oxygen and hydrogen being additionally present only in traces.

2. The coating as claimed in claim 1, wherein the coating comprises at least 99 at. % iridium and additionally carbon; or
    comprises at least 99 at. % iridium and additionally carbon and traces of oxygen or hydrogen; or
    comprises at least 99 at. % iridium and additionally carbon and fluorine; or
    comprises 15 to 98.9 at. % iridium and 0.1 to 84 at. % ruthenium and additionally carbon; or
    comprises 15 to 98.9 at. % iridium and 0.1 to 84 at. % of ruthenium and additionally carbon and traces of oxygen or hydrogen; or
    comprises 15 to 98.9 at. % iridium and 0.1 to 84 at. % of ruthenium and additionally carbon and fluorine.

3. The coating as claimed in claim 2, wherein
    the coating comprises iridium in a concentration of at least 99 at. % and carbon in a concentration in the range from 0.1 to 1 at. %, or
    the coating comprises iridium in a concentration of at least 99 at. % and nitrogen in a concentration in the range from 0.1 to 1 at. %, or
    the coating comprises iridium in a concentration in the range from 15 to 98.9 at. %, ruthenium in a concentration in the range from 0.1 to 84 at. % and carbon in a concentration in the range from 0.1 to 1 at. %, or
    the coating comprises iridium in a concentration in the range from 15 to 98.9 at. %, ruthenium in a concentration in the range from 0.1 to 84 at. % and nitrogen in a concentration in the range from 0.1 to 1 at. %.

4. The coating as claimed in claim 1, further comprising fluorine in a concentration not more than 0.5 at. %.

5. The coating as claimed claim 1, further comprising at least one chemical element selected from the group consisting of the base metals.

6. The coating as claimed in claim 5, wherein the at least one chemical element selected from the group consisting of the base metals is aluminum, iron, nickel, cobalt, zinc, cerium or tin.

7. The coating as claimed in claim 5, wherein the at least one chemical element selected from the group consisting of the base metals is present in a concentration range from 0.005 to 0.01 at. %.

8. The coating as claimed in claim 1 further comprising at least one refractory metal element selected from the group consisting of titanium, zirconium, hafnium, niobium, and tantalum.

9. The coating as claimed in claim 8, wherein the at least one refractory metal element is present in a concentration range from 0.005 to 0.01 at. %.

10. The coating as claimed in claim 1, further comprising at least one additional chemical element selected from the group consisting of the noble metals in a concentration range from 0.005 to 0.9 at. %.

11. The coating as claimed in claim 10, wherein the at least one chemical element selected from the group consisting of the noble metals is platinum, gold, silver, rhodium, or palladium.

12. The coating as claimed in claim 1, wherein the coating has a layer thickness between 1 nm and 50 nm.

13. A layer system for a bipolar plate of a fuel cell or an electrolyser, comprising a covering layer as claimed in claim 1 and an undercoat layer system.

14. The layer system as claimed in claim 13, wherein the undercoat layer system comprises at least one undercoat layer comprising at least one chemical element selected from the group consisting of titanium, niobium, hafnium, zirconium, and tantalum.

15. The layer system as claimed in claim 14, wherein the undercoat layer system comprises at least one first undercoat layer in the form of a metallic alloy layer comprising the chemical elements titanium and niobium.

16. The layer system as claimed in claim 15, wherein the undercoat layer system comprises a second undercoat layer comprising at least one chemical element selected from the group consisting of titanium, niobium, hafnium, zirconium, and tantalum and at least one nonmetallic element selected from the group consisting of nitrogen, carbon, boron, and fluorine.

17. The layer system as claimed in claim 16, wherein the second undercoat layer is arranged between the first undercoat layer and the covering layer.

18. The layer system as claimed in claim 16, wherein the second undercoat layer contains up to 5 at. % of oxygen.

19. A bipolar plate comprising a metallic substrate and a layer system as claimed in claim 13 applied to at least parts of a surface of the metallic substrate.

* * * * *